US008519859B2

(12) United States Patent
Forristal et al.

(10) Patent No.: US 8,519,859 B2
(45) Date of Patent: Aug. 27, 2013

(54) RACK SYSTEM COVER

(75) Inventors: Paul Forristal, Allen, TX (US); Michael Braucht, Dallas, TX (US)

(73) Assignee: Fujitsu Limited, Kawasaki-shi (JP)

( * ) Notice: Subject to any disclaimer, the term of this patent is extended or adjusted under 35 U.S.C. 154(b) by 460 days.

(21) Appl. No.: 12/791,588

(22) Filed: Jun. 1, 2010

(65) Prior Publication Data
US 2011/0291852 A1    Dec. 1, 2011

(51) Int. Cl.
*G08B 21/00* (2006.01)
*A47F 7/00* (2006.01)
*A47B 88/00* (2006.01)
*H05K 5/00* (2006.01)
*E05C 19/00* (2006.01)
*E05F 7/06* (2006.01)

(52) U.S. Cl.
USPC .......... 340/686.1; 211/26; 312/326; 312/219; 361/724; 292/118; 292/29; 292/218; 49/367; 49/396

(58) Field of Classification Search
USPC ...................................................... 340/686.1
See application file for complete search history.

(56) References Cited

U.S. PATENT DOCUMENTS

| 4,068,409 | A | * | 1/1978 | White | 49/367 |
| 4,477,130 | A | * | 10/1984 | Frantz | 312/219 |
| 7,360,659 | B1 | * | 4/2008 | Yoon et al. | 211/26 |
| 7,877,920 | B2 | * | 2/2011 | Szuminski et al. | 42/70.01 |
| 7,934,607 | B2 | * | 5/2011 | Henderson et al. | 211/26 |
| 7,946,433 | B2 | * | 5/2011 | Nguyen | 211/26 |
| 2002/0140325 | A1 | * | 10/2002 | Webster et al. | 312/223.1 |
| 2003/0141791 | A1 | * | 7/2003 | Dubon et al. | 312/333 |
| 2004/0080244 | A1 | * | 4/2004 | Lowther et al. | 312/205 |
| 2005/0200247 | A1 | * | 9/2005 | Tarasewicz | 312/223.1 |
| 2006/0158842 | A1 | * | 7/2006 | McAnally et al. | 361/686 |
| 2008/0007146 | A1 | * | 1/2008 | Hillman | 312/183 |

* cited by examiner

*Primary Examiner* — Jennifer Mehmood
*Assistant Examiner* — Fekadeselassie Girma
(74) *Attorney, Agent, or Firm* — Baker Botts L.L.P.

(57) ABSTRACT

A cover for use with a rack system defining a bay for mounting electronic components may comprise six mounting brackets, a door frame, two hinges, and a door. The six mounting brackets may each have a respective first end and a second end. The first end of each mounting bracket may be configured to attach to a respective junction plate associated with the bay. The door frame may be configured to attach to the second ends of the six mounting brackets. The two hinges may be disposed on the door frame. The door may be configured to mount on the two hinges and block access to the bay when closed.

15 Claims, 8 Drawing Sheets

RACK SYSTEM COVER

TECHNICAL FIELD OF THE INVENTION

The present invention relates generally to rack systems for a telecommunications network, and more particularly to a rack system cover.

BACKGROUND

Telecommunications systems, cable television systems, and data communication networks use optical networks to rapidly convey large amounts of information between remote points. In an optical network, information is conveyed in the form of optical signals through optical fibers. Optical fibers comprise thin strands of glass capable of transmitting the signals over long distances with very low loss. Optical networks provide higher capacity and reduced operating costs compared to traditional technologies. Fiber-optic networks may include a system of multiple network components, including switches, routers, converters, modulators, demodulators, etc.

A communications network may include one or more rack systems. A rack system includes two or more vertical posts providing a bay for mounting various components of the network system (e.g., a rack server). The rack system provides a plurality of mounting slots known as shelves configured to hold a rack server and/or other network components. Using a rack system may allow multiple components to be stacked vertically, providing a relatively small footprint and simplifying cable connections between various components.

SUMMARY

In accordance with a particular embodiment of the present invention, a cover for use with a rack system defining a bay for mounting electronic components may comprise six mounting brackets, a door frame, two hinges, and a door. The six mounting brackets may each have a respective first end and a second end. The first end of each mounting bracket may be configured to attach to a respective junction plate associated with the bay. The door frame may be configured to attach to the second ends of the six mounting brackets. The two hinges may be disposed on the door frame. The door may be configured to mount on the two hinges and block access to the bay when closed.

In accordance with another particular embodiment of the present invention, a rack system for mounting electronic components may comprise a plurality of upright posts, a set of junction plates, six mounting brackets, a door frame, two hinges, and a door. Each set of two upright posts may define a bay providing a plurality of mounting points for mounting electronic components within the bay. The set of junction plates may be mounted between adjacent bays and be configured to fix the adjacent bays to one another. The six mounting brackets may each have a respective first end and a second end. The first end of each mounting bracket may be configured to attach to one of the junction plates associated with a specific bay. The door frame may be configured to attach to the second ends of the six mounting brackets. The two hinges may be disposed on the door frame. The door may be configured to mount on the two hinges and block access to the specific bay when closed.

In accordance with another particular embodiment of the present invention, a communications network system may comprise a plurality of upright posts, a plurality of electronic components, a set of junction plates, six mounting brackets, a door frame, two hinges, and a door. Each set of two upright posts may define a bay providing a plurality of mounting points for mounting electronic components within the bay. The plurality of electronic components may provide communications capability to the communications network and may be mounted in the plurality of bays. The set of junction plates may be mounted between adjacent bays and configured to fix the adjacent bays to one another. The six mounting brackets may each have a respective first end and a second end. The first end of each mounting bracket may be configured to attach to one of the junction plates associated with a specific bay. The door frame may be configured to attach to the second ends of the six mounting brackets. The two hinges may be disposed on the door frame. The door may be configured to mount on the two hinges and block access to the plurality of electronic components within the specific bay when closed.

The teachings of the present disclosure may provide a variety of benefits in comparison to known alternatives. When network equipment racks are disposed in facility along with equipment from other providers, it may be difficult to control access to the equipment. Some previously known solutions include complete wrap around cages disposed around stand-alone bays and fencing around sets of bays. Facility managers, however, typically prefer to dispose equipment in a lineup of bays to maximize the amount of equipment installed for a given space.

The teachings of the present disclosure may provide security against unapproved maintenance, deliberate tampering, and/or inadvertent physical contact (e.g., accidentally bumping switches and/or connections). The rack system covers disclosed herein may be installed on pre-existing and pre-populated rack systems. They may be installed and operated without encroaching on the space of neighboring bays. The teachings of the present disclosure may provide increased airflow and/or ventilation in comparison to known security solutions, as well as full visibility to equipment (e.g., LEDs, alarms, etc.). In addition, the rack system covers of the present disclosure may provide full access for cable/fiber ingress/egress from the front of the shelves and restrict access to cable connections on the rear of the equipment.

It will be understood that the various embodiments of the present invention may include some, all, or none of the enumerated technical advantages. In addition, other technical advantages of the present invention may be readily apparent to one skilled in the art from the figures, description and claims included herein.

DETAILED DESCRIPTION

Preferred embodiments and their advantages are best understood by reference to FIGS. 1 through 9, wherein like numbers are used to indicate like and corresponding parts. Modular communication systems may employ rack systems to mount a variety of electronic components.

Figure 1:
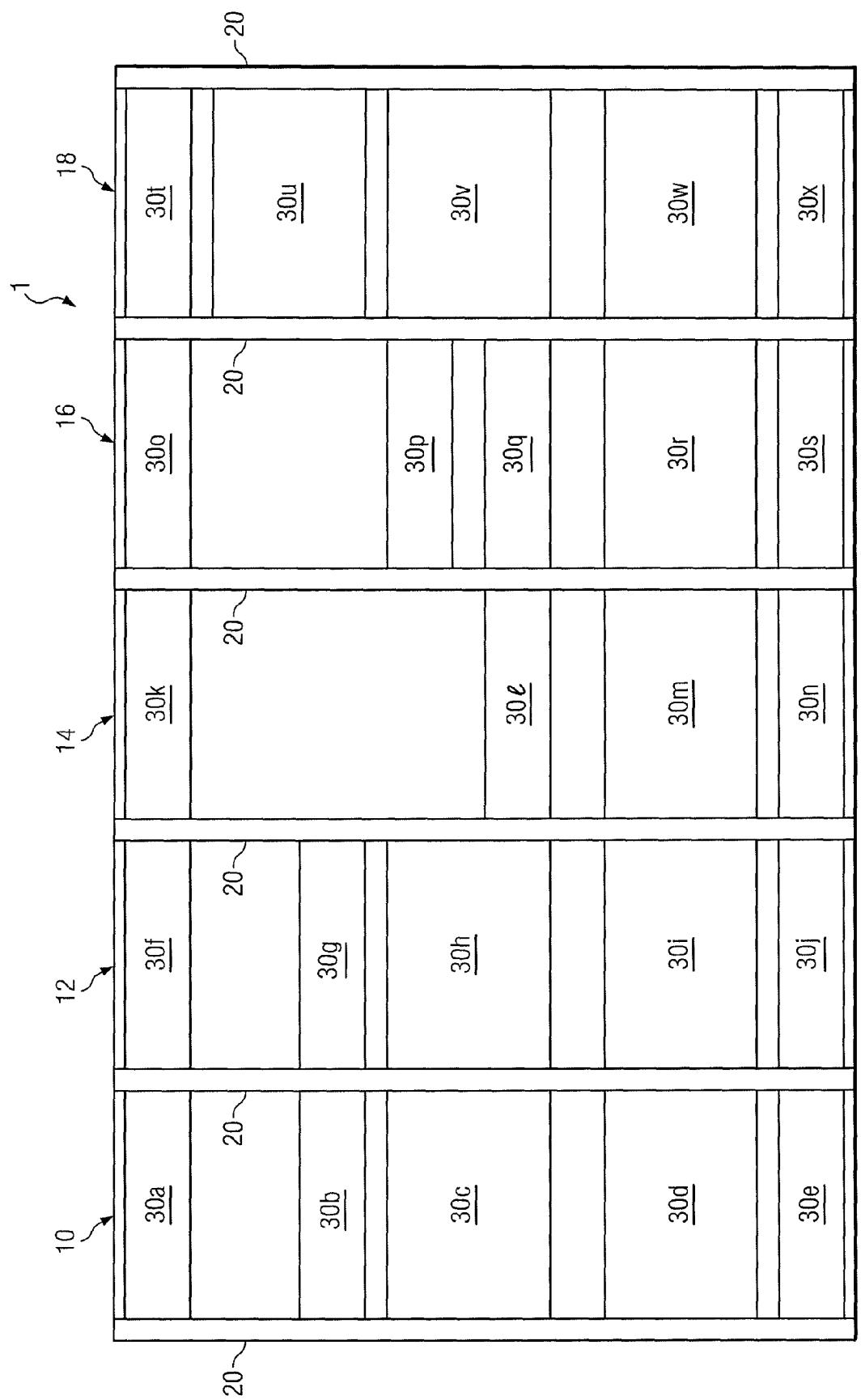
FIG. 1 illustrates example components of a communication system including a set of bays and racks incorporating teachings of the present disclosure.

FIG. 1 illustrates example components of a communication system including a set of bays and racks incorporating teachings of the present disclosure, included rack system 1. Rack system 1 may define one or more bays 10, 12, 14, 16, and 18. Each bay 10, 12, 14, 16, 18 may provide a plurality of mounting points for electronic components 30a-30x. Rack system 1 may be used for a variety of applications. In some embodiments, rack system 1 may house various components of a communications system. Example rack systems include a relay rack and a telecom network bay.

Rack system 1 may include two or more upright posts 20. Upright posts 20 may include any device, component, and/or feature of rack system 1 configured to define one or more bays between two adjacent upright posts 20. In the embodiment shown in FIG. 1, upright posts 20 define bays 10, 12, 14, 16, and 18.

Electronic components 30a-30x may comprise any suitable hardware and/or software operable to provide functionality for the communications system, including any memory, processor, or other components. Electronic components 30a-30x may provide networking applications, such as telecommunications or data routing. Electronic components 30a-30x may comprise physical interfaces on the front side, the back side, or both to connect to other network components and send signals to and receive signals from such other network components. Other embodiments may comprise a plurality of electronic components 30a-30x.

Various components of rack system 1 may provide a variety of functions, such as providing electrical connectivity between components of rack system 1 and transmitting signals between these components. Electronic components 30a-30x may include I/O panels comprising a variety of connectors for transmitting one or more signals. For example, some I/O panels may comprise one or more DS1 or DS3 connections. Other I/O panels may comprise Ethernet connections, such as 10BASE-T, 100BASE-T, or 1000BASE-T. The type of I/O panel may be selected by a user to provide the connections that the user needs for his or her applications. The user may also select an I/O panel that provides a protected interface or one that provides an unprotected interface.

Figure 2:
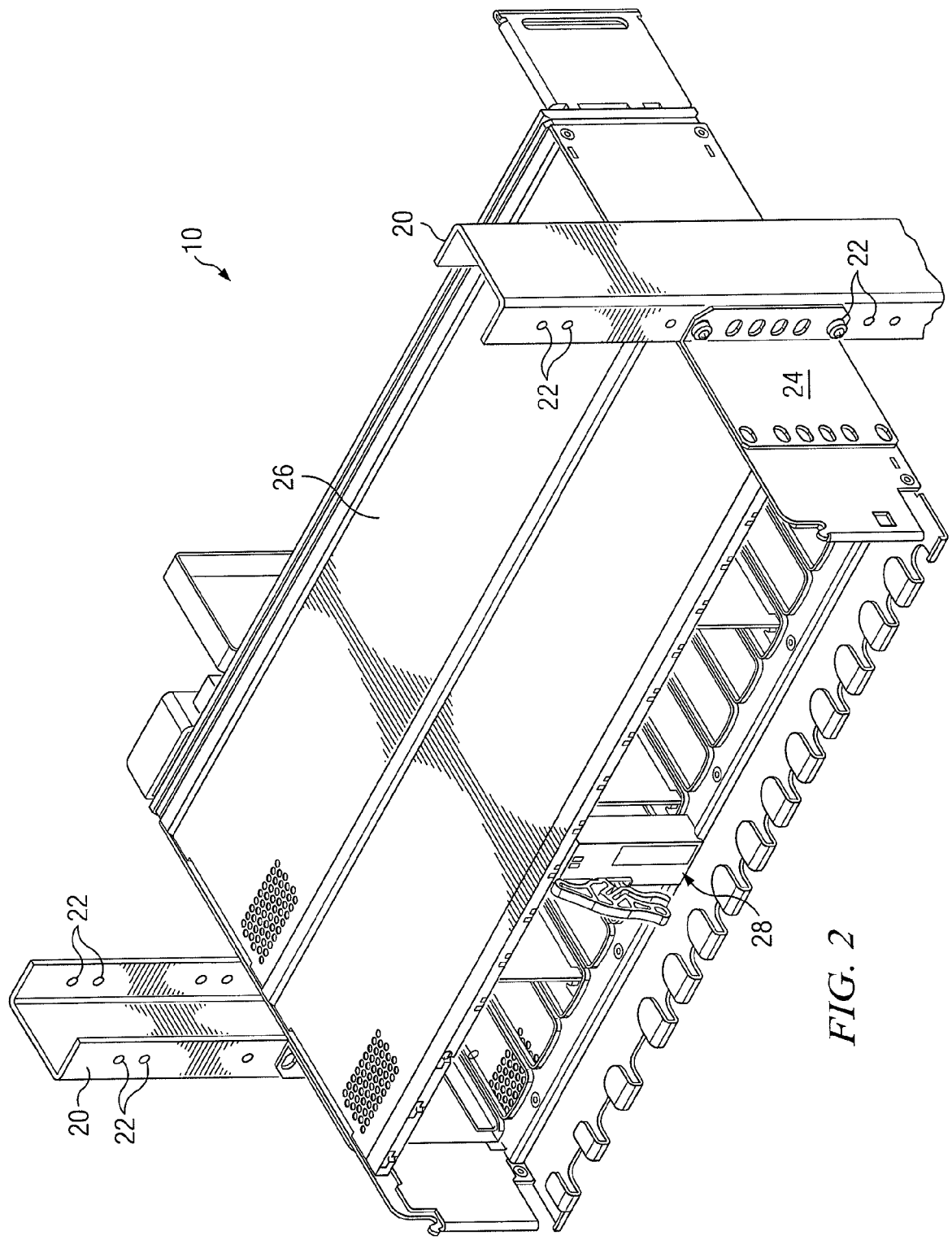
FIG. 2 illustrates an example shelf for mounting electronics components housed in a rack system, in accordance with the teachings of the present disclosure.

FIG. 2 illustrates an example chassis 26 for mounting plug-in units 28 housed in bay 10 of rack system 1, in accordance with the teachings of the present disclosure. Chassis 26 may provide connection points for a plurality of plug-in units 28 and/or additional electronics components 30. As shown in FIG. 2, chassis 26 may include brackets 24 connecting chassis 26 to upright posts 20. Brackets 24 may include any device, component, and/or feature of chassis 26 configured to mount to one or more features of upright posts 20. In some embodiments, brackets 24 may define holes configured to line up with holes 22 on upright posts 20.

Figure 3:
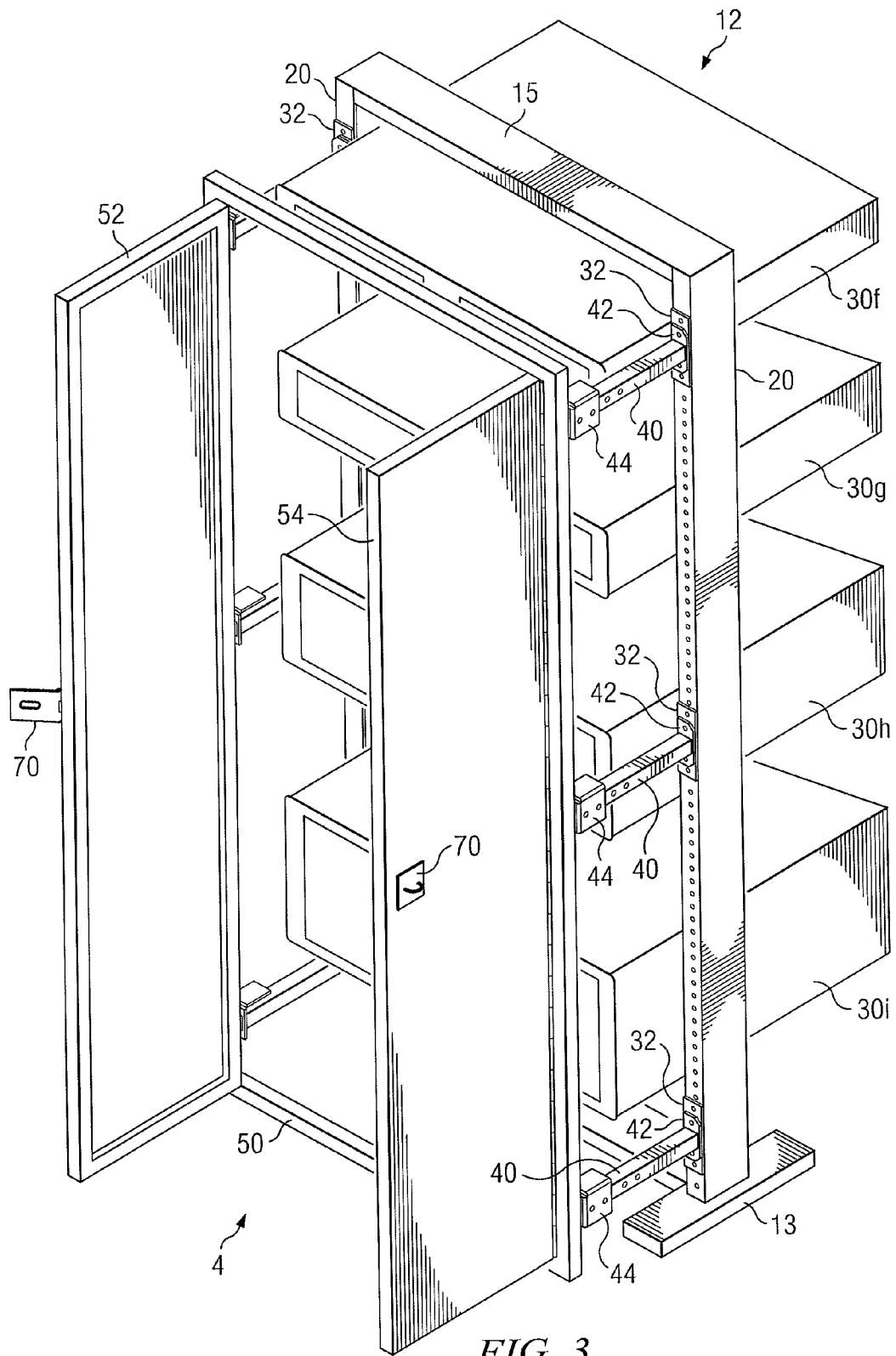
FIG. 3 illustrates an example rack cover system, incorporating teachings of the present disclosure.

FIG. 3 illustrates components of an example rack cover system 4, incorporating teachings of the present disclosure. Rack cover system 4 may include mounting brackets 40, door frame 50, and doors 52 and 54. As shown in FIG. 3, rack cover system 4 may be mounted on an individual bay of rack system 1, such as bay 12. Bay 12 may be defined by two upright posts 20, footing 13, and cross bar 15. Upright posts 20, footing 13, and cross bar 15 may include any structural material configured to provide support for electronics components 30 mounted therein (e.g., channel bar, poles, angle iron, etc.). In addition, rack system 1 may include junction plates 32. Junction plates 32 may provide connection points to fasten neighboring bays to one another and/or to fix two upright posts 20 to each other.

Mounting brackets 40 may be configured to attach to upright posts 20 at the same location junction plates 32 are attached, as shown in FIG. 3. Using the same holes 22 on upright posts 20 may provide several advantages over alternative locations. For example, the location of the junction plates is relatively consistent across several manufacturers of rack systems. As another example, using any other location may restrict the options for users to mount electronic components 30 because mounting brackets 40 would occupy some of the mounting holes 22. As another example, some electronic components 30 may block access to certain holes 22 because of their size or shape. In some embodiments, upright posts 20 may include dedicated mounting holes for the junction plates 32. In those embodiments, electronic components 30 may not be configured to mount at the dedicated mounting holes. For example, a telecom network bay includes a separate set of mounting holes for junction plates 32.

Embodiments configured to connect mounting brackets 40 on top of junction plates 32 allow a user to install rack cover system 4 on an existing rack system already populated with electronics components 30. Rack cover system 4 may be installed on any bay (e.g., bay 12) of a rack system without encroaching on the neighboring bays (e.g., bay 10 and bay 14).

Mounting brackets 40 may include a first end 42, a second end 44, and holes 46. These features are discussed in more detail in relation to FIGS. 6A and 6B. First end 42 may be configured to mount on top of junction plates 32 and/or to attach to various holes 22 of upright posts 20. Second end 44 may be configured to attach to door frame 50. If several mounting brackets 40 are used, door frame 50 may be rigidly attached to rack system 1 and/or upright posts 20 at a fixed distance away from upright posts 20.

Door frame 50 may include various features and/or details providing a mounting point for one or more doors 52 and 54. When doors 52 and 54 are closed, a person standing in front of bay 12 may be restricted from accessing electronics components 30f-30i mounted in bay 12. Such a restriction may provide security against inadvertent maintenance and/or tampering. In some embodiments, an alarm may be associated with one or more doors to provide an alert when the door is opened. One embodiment of an alarm for use in accordance with the teachings of the present disclosure is discussed in relation to FIG. 8. These features may provide some advantages when electronics components 30 are deployed in a network facility housing equipment belonging to more than one customer. Doors 52 and 54 may include a hasp 70 configured to allow a user to mount a lock to maintain doors 52 and 54 in the closed position.

Figure 4:
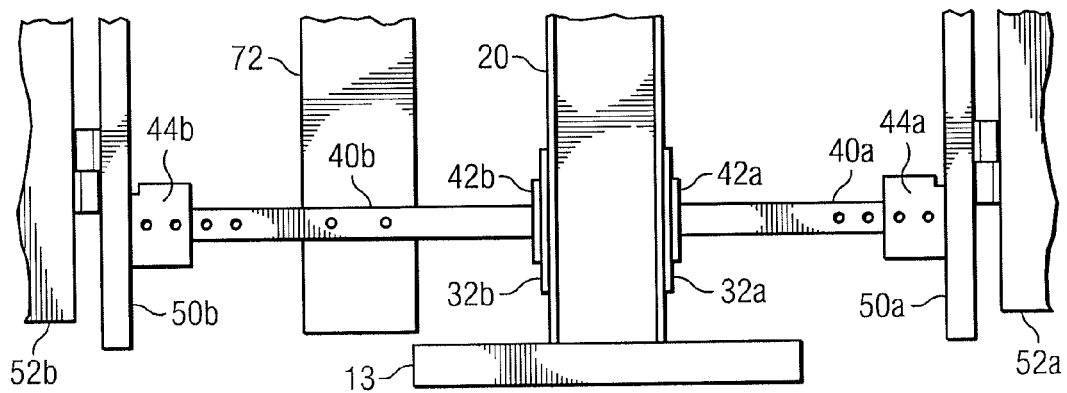
FIG. 4 illustrates a detailed view of the example rack cover system from FIG. 3.

FIG. 4 illustrates a detailed side view of a part of rack cover system 4. FIG. 4 shows two mounting brackets 40a and 40b on opposite sides of bay 12. First ends 42a and 42b may be mounted opposite one another in conjunction with junction plates 32. Second ends 44a and 44b may provide connection points for door frames 50a and 50b with associated doors 52a and 52b. Mounting a door 52 on each side of bay 12 may provide increased security in comparison to embodiments with a single door 52 on only one side of bay 12. In some embodiments, a security panel 72 may be mounted in association with mounting bracket 40. As shown in FIG. 4, security panel 72 may restrict access between door frame 50b and upright post 20.

Figure 5:
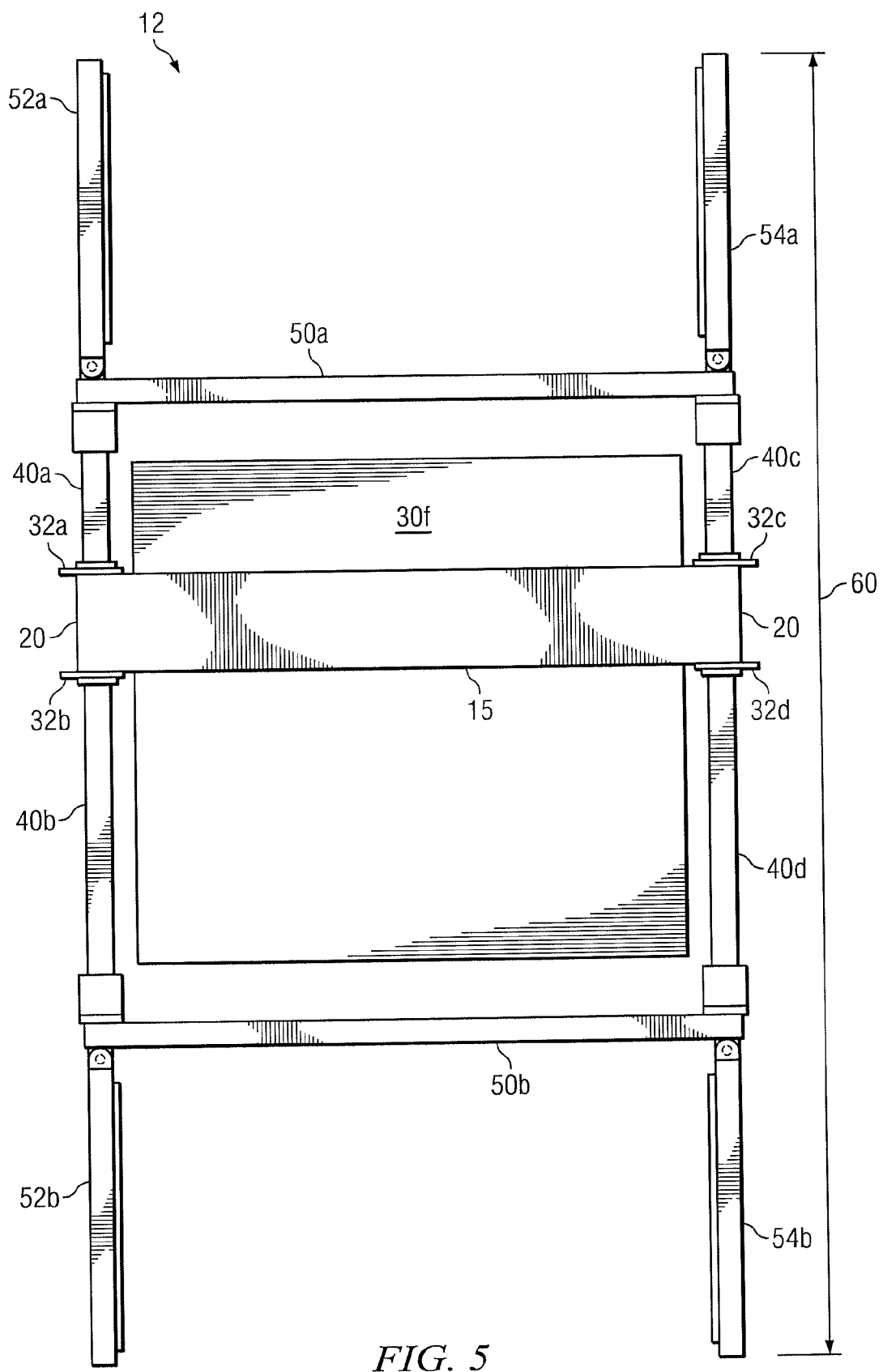
FIG. 5 shows an overhead view of the example rack cover system from FIG. 3.

FIG. 5 shows an overhead view of rack cover system 4, including cross bar 15 and doors 52a, 52b, 54a, and 54b. Embodiments including four doors, such as that shown in FIG. 5, may require a smaller total depth 60 when compared to embodiments employing a single door on each side of bay 12.

Figure 6A:
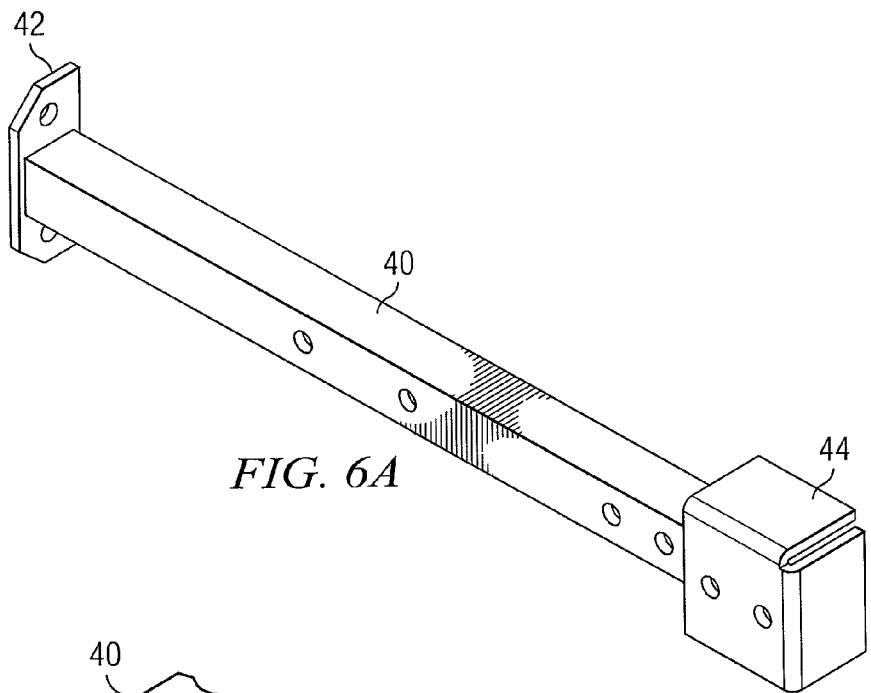
FIGS. 6A and 6B illustrate detailed views of components for use in a rack cover system, in accordance with teachings of the present disclosure.
Figure 6B:
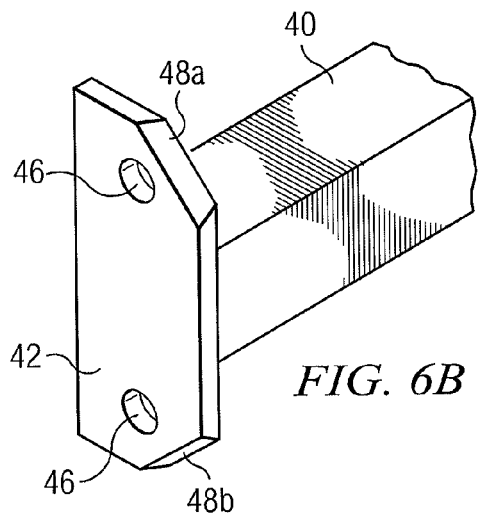

FIGS. 6A and 6B illustrate detailed views of an example mounting bracket 40, in accordance with teachings of the present disclosure. As discussed above, mounting bracket 40 may include first end 42, second end 44, and holes 46. Holes 46 may be configured to align with features of junction brackets 32 and/or upright posts 20. For example, holes 46 of mounting bracket 40 may be configured to align with holes 22 of upright posts 20 allowing connection by bolts and/or other connectors.

As shown in FIG. 6B, first end 42 of mounting bracket 40 may include bevels in at least two planes 48a and 48b. Bevels 48 may provide clearance for attaching mounting brackets 40 to upright posts 20 on top of junction plates 32. For example, first end 42 may be attached to upright posts 20 with bolts. Various features of junction plates 32, upright posts 20, and/or the connectors may require the clearance provided by bevels 48.

Figure 7:
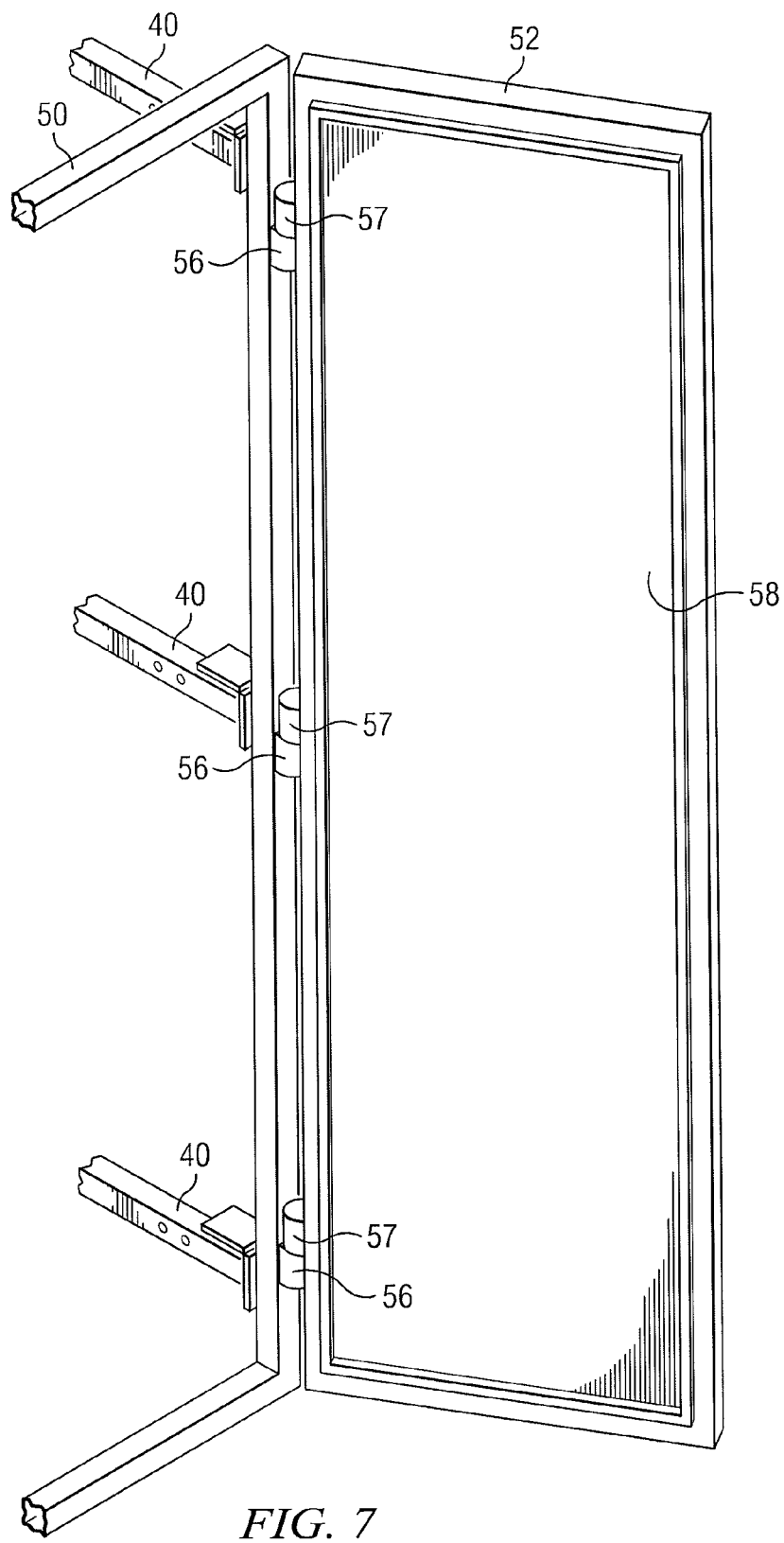
FIG. 7 illustrates a detailed view of components for use in a rack cover system, in accordance with teachings of the present disclosure.

FIG. 7 illustrates a detailed view of the connections between door frame 50 and door 52, in accordance with teachings of the present disclosure. As shown in FIG. 7, door frame 50 may include one or more associated hinges including rests 56 and hangers 57. In some embodiments of rack cover system 4, rest 56 may include a peg and/or a post configured to protrude upward into hanger 57. Hanger 57 may be configured to rotate around the post of rest 56. In some examples, the hinge may comprise a barrel hinge. In some embodiments, door 52 may be lifted off of its one or more hinges by a user. In those embodiments, door 52 may rest within door frame 50 when in the closed position, therefore restricting the removal of door 52 while in the closed position.

Door 50 may include door panel 58. Door panel 58 may comprise any appropriate material. For example, door panel 58 may include perforated material. The choice of perforated material in door panel 58, for example, may allow airflow comparable to an open bay. A choice restricting air flow may affect the cooling of electronic components 30 mounted therein, and may negatively affect performance. As another example, perforated material may allow visibility of components, LEDs, and/or other indicators associated with electronic components 30. Doors 52 and 54 may also include features, devices, and/or components configured to allow a customer and/or a user to mount a separate lock restricting the operation of the doors.

Figure 8:
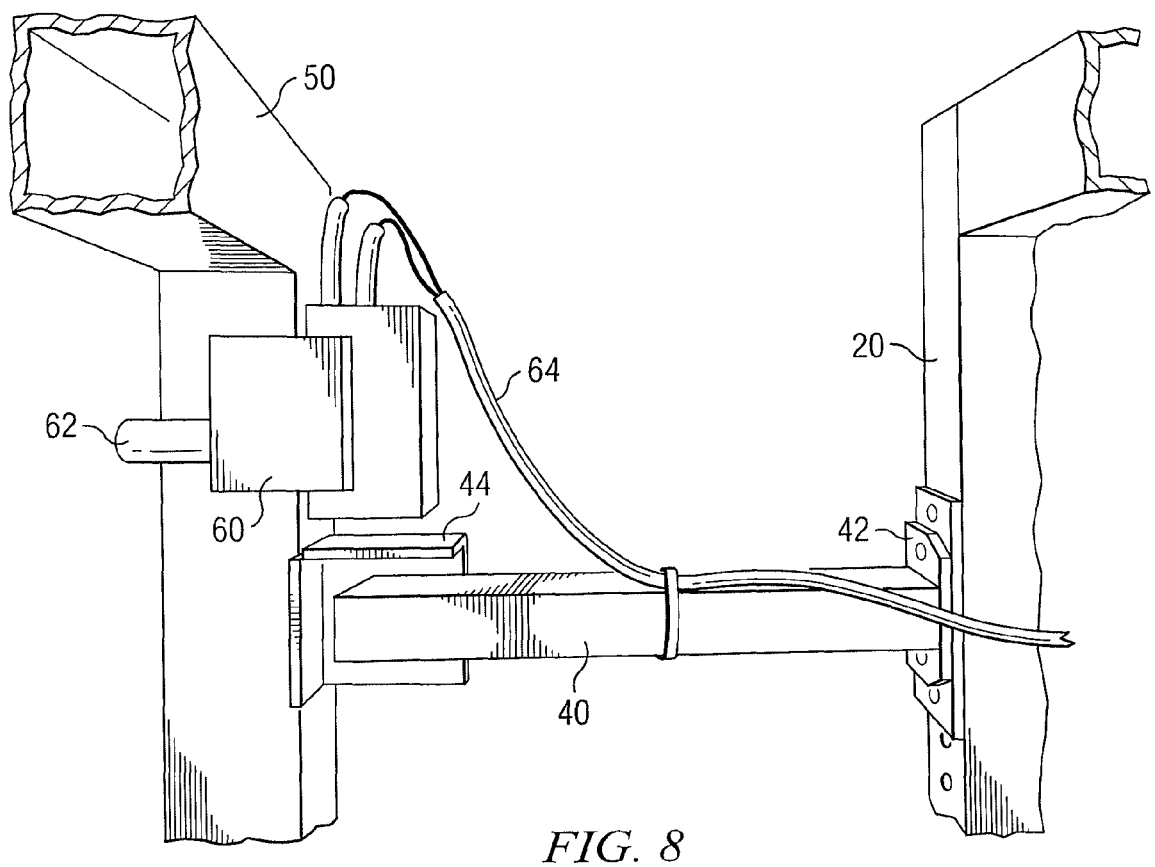
FIG. 8 shows an example alarm that may be used in accordance with the teachings of the present disclosure.

FIG. 8 shows an example alarm 60 that may be used in accordance with the teachings of the present disclosure. Alarm 60 may be configured to generate a signal if door 52 is opened. Some embodiments of rack cover system 4 may include more than one alarm 60, e.g., one for each door 52. Alarm 60 may include sensor 62 and wiring 64. Sensor 62 may be any device, feature, and/or component of alarm 60 configured to sense when door 52 is opened. For example, sensor 62 may include a plunger, electrical contacts, etc. If sensor 62 senses that door 52 is opened, it may generate a signal. The signal may include any communication to a system manager, a human user, or the like. For example, alarm 60 may generate an electronic signal and transmit that signal through wiring 64 to a monitor and/or system manager. In another example, alarm 60 may generate an audible signal and wiring 64 may provide power to alarm 60.

Figure 9:
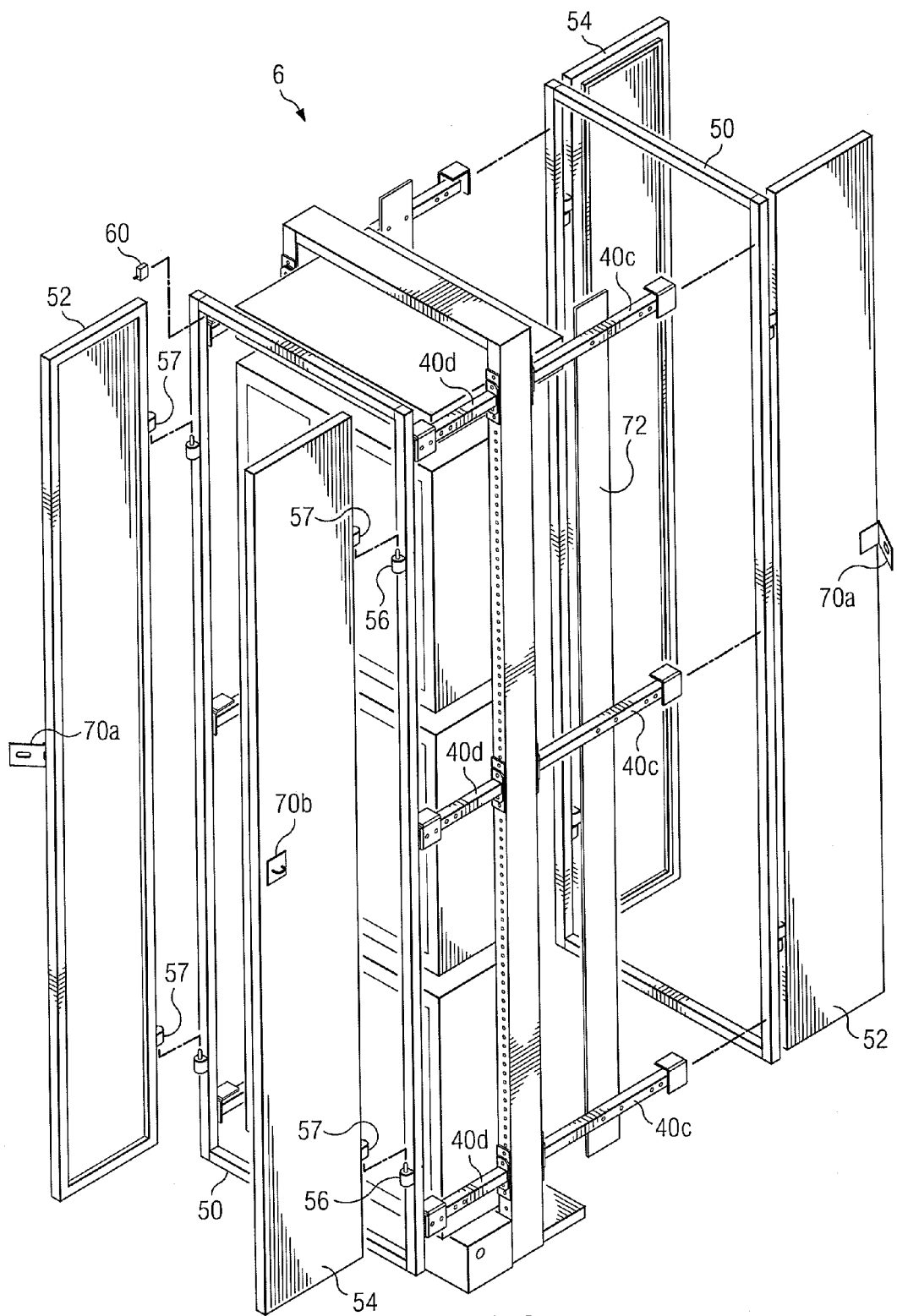
FIG. 9 shows another example rack cover system, incorporating teachings of the present disclosure.

FIG. 9 shows another example rack cover system 6, incorporating teachings of the present disclosure. Rack cover system 6 may include any or all of the components discussed in relation to rack cover system 4. Rack cover system 6 may be used with different rack systems in comparison to rack cover system 4. Although the present invention has been described with several embodiments, various changes and modifications may be suggested to one skilled in the art. It is intended that the present invention encompass such changes and modifications as fall within the scope of the appended claims.

What is claimed is:

1. A cover for use with a rack system including at least two upright posts defining a bay configured for mounting electronic components, the cover comprising:
   a plurality of mounting brackets, each having a respective first end and a second end;
   the first end of each mounting bracket configured to attach to a respective junction plate associated with the rack system;
   a door frame configured to attach to the second ends of the plurality of mounting brackets;
   a first set of hinges and a second set of hinges disposed on opposite sides of the door frame; and
   a first door configured to mount on the first set of hinges and a second door configured to mount on the second set of hinges, the doors blocking access to the bay when closed, the doors and hinges configured such that the doors are removable by lifting the doors off of the hinges.

2. A cover according to claim 1, further comprising:
   the door comprising perforations configured to allow air flow through the cover.

3. A cover according to claim 1, further comprising an alarm configured to provide an alert signal if the door is opened.

4. A cover according to claim 1, further comprising:
   the door frame having a width substantially equal to the distance between the outsides of the at least two upright posts of the rack system; and
   the door configured to remain within the width of the door frame while open.

5. A cover according to claim 1, further comprising a hasp disposed on the door, the hasp configured to resist opening the door when engaged, and the hasp configured to accept a lock to keep the hasp engaged.

6. A rack system for mounting electronic components, the rack system comprising:
   a plurality of upright posts, each set of two upright posts defining a bay providing a plurality of mounting points for mounting electronic components within the bay;
   a set of junction plates mounted between adjacent bays, the set of junction plates configured to fix the adjacent bays to one another;
   a plurality of mounting brackets, each having a respective first end and a second end;
   the first end of each mounting bracket configured to attach to one of the junction plates associated with a specific rack;
   a door frame configured to attach to the second ends of the plurality of mounting brackets;
   a first set of hinges and a second set of hinges disposed on opposite sides of the door frame; and
   a first door configured to mount on the first set of hinges and a second door configured to mount on the second set of hinges, the doors blocking access to the bay when closed, the doors and hinges configured such that the doors are removable by lifting the doors off of the hinges.

7. A rack system according to claim 6, further comprising:
the door comprising perforations configured to allow air flow through the cover.

8. A rack system according to claim 6, further comprising an alarm configured to provide an alert signal if the door is opened.

9. A rack system according to claim 6, further comprising:
the door frame having a width of approximately the outside width of the bay; and
the door configured to remain within the width of the door frame while open.

10. A rack system according to claim 6, further comprising a hasp disposed on the door, the hasp configured to resist opening the door when engaged, and the hasp configured to accept a lock to keep the hasp engaged.

11. A communications network system comprising:
a plurality of upright posts, each set of two upright posts defining a bay providing a plurality of mounting points for mounting electronic components within the bay;
a plurality of electronic components providing communications capability to the communications network, each of the plurality of electronic components mounted to a respective one of the plurality of mounting points;
a set of junction plates mounted between adjacent bays, the set of junction plates configured to fix the adjacent bays to one another;
a plurality of mounting brackets, each having a respective first end and a second end;
the first end of each mounting bracket configured to attach to one of the junction plates associated with a specific bay;
a door frame configured to attach to the second ends of the plurality of mounting brackets;
a first set of hinges and a second set of hinges disposed on opposite sides of the door frame; and
a first door configured to mount on the first set of hinges and a second door configured to mount on the second set of hinges, the doors blocking access to the plurality of electronic components within the bay when closed, the doors and hinges configured such that the doors are removable by lifting the doors off of the hinges.

12. A communications network system according to claim 11, further comprising:
the door comprising perforations configured to allow air flow through the cover.

13. A communications network system according to claim 11, further comprising an alarm configured to provide an alert signal if the door is opened.

14. A communications network system according to claim 11, further comprising:
the door frame having a width of approximately the outside width of the bay; and
the door configured to remain within the width of the door frame while open.

15. A communications network system according to claim 11, further comprising a hasp disposed on the door, the hasp configured to resist opening the door when engaged, and the hasp configured to accept a lock to keep the hasp engaged.

* * * * *